(12) United States Patent
Tedeschi et al.

(10) Patent No.: US 12,094,716 B2
(45) Date of Patent: Sep. 17, 2024

(54) CHAMBERS AND COATINGS FOR REDUCING BACKSIDE DAMAGE

(71) Applicant: Applied Materials, Inc., Santa Clara, CA (US)

(72) Inventors: Leonard M. Tedeschi, San Jose, CA (US); Kartik Ramaswamy, San Jose, CA (US); Benjamin C E Schwarz, San Jose, CA (US); Changgong Wang, San Jose, CA (US); Vahid Firouzdor, Hillsborough, CA (US); Sumanth Banda, San Jose, CA (US); Teng-Fang Kou, Kaohsiung (TW)

(73) Assignee: Applied Materials, Inc., Santa Clara, CA (US)

( * ) Notice: Subject to any disclaimer, the term of this patent is extended or adjusted under 35 U.S.C. 154(b) by 145 days.

(21) Appl. No.: 17/473,821

(22) Filed: Sep. 13, 2021

(65) Prior Publication Data

US 2023/0077578 A1    Mar. 16, 2023

(51) Int. Cl.
*H01L 21/02* (2006.01)
*H01J 37/32* (2006.01)
*H01L 21/3065* (2006.01)
*H01L 21/311* (2006.01)
*H01L 21/683* (2006.01)

(52) U.S. Cl.
CPC .... *H01L 21/3065* (2013.01); *H01J 37/32862* (2013.01); *H01L 21/02274* (2013.01); *H01L 21/31116* (2013.01); *H01L 21/6833* (2013.01); *H01J 2237/332* (2013.01); *H01J 2237/334* (2013.01)

(58) Field of Classification Search
CPC .......... H01L 21/3065; H01L 21/02274; H01L 21/31116; H01L 21/6833; H01L 21/0209; H01L 21/02115; H01L 21/6719; H01L 21/6831; H01J 37/32862; H01J 2237/332; H01J 2237/334
See application file for complete search history.

(56) References Cited

U.S. PATENT DOCUMENTS

2003/0096507 A1   5/2003   Baker et al.
2008/0132072 A1   6/2008   Letz et al.
(Continued)

FOREIGN PATENT DOCUMENTS

TW   201608053 A    3/2016
TW   202025242 A    7/2020
WO   2014011914 A1  1/2014

OTHER PUBLICATIONS

Application No. PCT/US2022/042650, International Search Report and the Written Opinion, dated Dec. 22, 2022, 11 pages.

*Primary Examiner* — Elias Ullah
(74) *Attorney, Agent, or Firm* — Kilpatrick Townsend & Stockton LLP (57) ABSTRACT

Methods of semiconductor processing may include forming a plasma of a carbon-containing material within a processing region of a semiconductor processing chamber. The methods may include depositing a carbon-containing material on a backside of a substrate housed within the processing region of the semiconductor processing chamber. A front side of the substrate may be maintained substantially free of carbon-containing material. The methods may include performing an etch process on the front-side of the substrate. The methods may include removing the carbon-containing material from the backside of the substrate.

19 Claims, 5 Drawing Sheets

(56) References Cited

U.S. PATENT DOCUMENTS

| | | |
|---|---|---|
| 2008/0141509 A1 | 6/2008 | Nishimura |
| 2010/0093161 A1 | 4/2010 | Kusumoto et al. |
| 2014/0147990 A1 | 5/2014 | Hawrylchak et al. |
| 2020/0388517 A1 | 12/2020 | Rohrmann et al. |

CHAMBERS AND COATINGS FOR REDUCING BACKSIDE DAMAGE

TECHNICAL FIELD

The present technology relates to semiconductor systems, processes, and equipment. More specifically, the present technology relates to processes and systems to protect substrates on support assemblies.

BACKGROUND

Many substrate processing systems use substrate supports, such as an electrostatic chuck in combination with a base, to retain a wafer during semiconductor substrate processing. An embedded electrode may electrostatically chuck a wafer or substrate to the substrate support. A voltage may be applied to the electrode, which provides the clamping force. However, this clamping force may cause backside damage to the substrate, and also may produce backside particles that can cause issues in subsequent processing.

Thus, there is a need for improved systems and methods that can be used to improve lifetime and performance of processing chambers and components. These and other needs are addressed by the present technology.

SUMMARY

Methods of semiconductor processing may include forming a plasma of a carbon-containing material within a processing region of a semiconductor processing chamber. The methods may include depositing a carbon-containing material on a backside of a substrate housed within the processing region of the semiconductor processing chamber. A front side of the substrate may be maintained substantially free of carbon-containing material. The methods may include performing an etch process on the front-side of the substrate. The methods may include removing the carbon-containing material from the backside of the substrate.

In some embodiments, the semiconductor processing chamber may be a first chamber, and the method may include, subsequent to the depositing, transferring the substrate to a second chamber in which the etch process may be performed. The methods may include, subsequent to the etch process, transferring the substrate back to the first chamber in which the removing may be performed. The first chamber and the second chamber may be contained on a single processing platform. Removing the carbon-containing material from the backside of the substrate may include forming a plasma of an oxygen-containing material. Removing the carbon-containing material from the backside of the substrate may include etching the carbon-containing material from the backside of the substrate. The substrate may include a first backside coating including a silicon-containing material. The carbon-containing material may be deposited overlying the silicon-containing material. The semiconductor processing chamber may include a substrate support. The substrate may be seated on the substrate support about an outer edge of the substrate. The semiconductor processing chamber may define a volume beneath the substrate seated on the substrate support. The plasma of the carbon-containing material may be formed in the volume beneath the substrate seated on the substrate support.

Some embodiments of the present technology may encompass semiconductor processing chambers. The chambers may include a substrate support. The substrate support may include a platform defining an annular seat operable to support a semiconductor substrate about a periphery of the semiconductor substrate. The platform may define an internal recess extending within the annular seat. The substrate support may include one or more electrodes operable to seat a wafer or generate plasma within the internal recess.

In some embodiments, the platform may include a recessed base defining the internal recess. The one or more electrodes may include an electrode extending about the recessed base as a coil operable as an inductively-coupled plasma coil. The recessed base may be or include a dielectric material. The platform may include an electrode in the annular seat. The electrode may be operable as an electrostatic chuck for the semiconductor substrate. The platform may include a recessed base defining the internal recess. The recessed base may be grounded relative to the annular seat. A capacitively-coupled plasma may be formable within the internal recess. The semiconductor processing chamber may include a portion of a toroidal plasma loop extending into the internal recess. The chamber may be operable to deliver plasma effluents into the internal recess. A portion of the toroidal plasma loop may extend outside of the semiconductor processing chamber. The portion of the toroidal plasma loop extending outside of the semiconductor processing chamber may define an access for precursor delivery. The substrate support may define one or more accesses for precursor delivery into the internal recess. The substrate support may define one or more accesses for exhaust from the internal recess.

Some embodiments of the present technology may encompass methods of semiconductor processing. The methods may include forming a plasma of a carbon-containing material within a processing region of a semiconductor processing chamber. The semiconductor processing chamber may include a substrate support. The substrate support may include a platform defining an annular seat operable to support a semiconductor substrate about a periphery of the semiconductor substrate. The platform may define an internal recess extending within the annular seat. The substrate support may include one or more electrodes operable to seat a substrate or generate plasma within the internal recess. The methods may include depositing a carbon-containing material on a backside of a substrate housed within the processing region of the semiconductor processing chamber.

In some embodiments, a front side of the substrate may be maintained substantially free of carbon-containing material during the depositing. The methods may include performing an etch process on the front-side of the substrate. The methods may include removing the carbon-containing material from the backside of the substrate.

Such technology may provide numerous benefits over conventional systems and techniques. For example, the processes may reduce or limit backside particles, which may facilitate downstream processing. Additionally, processing chambers according to some embodiments of the present technology may form protective films on a backside of a substrate while limiting or preventing formation on a front side of a wafer. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma etching processes may energize one or more constituent precursors to facilitate material removal from a substrate. The conditions of the process may cause a substrate to be dislodged or shifted if not properly clamped. Additionally, the formed films on a substrate may cause stresses on the substrate. For example, as processing may include more films to produce complex structures, thicker layers of material may be developed on a substrate. These produced films may be characterized by internal stresses that act upon the substrate. This may cause a substrate to bow during processing, which if not controlled can lead to poor uniformity of removal, as well as device damage or malfunction.

An electrostatic chuck may be used to produce a clamping action against the substrate to overcome the bowing stress and maintain the substrate during etch processes. However, as these device structures increase in thickness and complexity, the stresses acted upon the substrate increase, which may require a proportional increase in chucking voltage. Additionally, many etch processes may be performed at relatively high temperatures that further affect components of the chamber. For example, some etch activities may occur at temperatures of several hundred degrees or higher, which may cause the substrate to thermally expand outward radially. The expansion, in combination with the increased chucking voltage, may cause scratches to be formed on the backside of a semiconductor substrate in contact with the substrate support, as well as cause particles to be dislodged from the underlying chuck body.

As one non-limiting example, many processes may utilize a coating within the chamber, which may act to protect chamber components during semiconductor processing. However, this coating may interact with the wafer. For example, an oxide chamber coating may extend across the electrostatic chuck. The substrate may be positioned overlying the chuck and coating. Because an oxide layer may be characterized by higher hydrophilicity, an amount of stiction may occur between the material and the substrate that may be clamped and forcibly constrained against the material. Subsequent to clamping, as the substrate acclimates to the chamber temperature, the thermal expansion may cause an amount of the oxide layer coating to be separated from the rest of the coating, and which may adhere to the backside of the substrate as particulate material after dechuck.

These scratches and particles may cause multiple challenges. For example, when a substrate is removed from processing and replaced in a front-opening unified pod with other processed substrates, particles generated from the contact may fall to underlying substrates, which may act as defects in the produced films for the underlying substrates. Additionally, some subsequent processing may be affected by the damage. For example, subsequent operations may include lithography. Backside damage may cause displacement of the projected beam through the substrate, which may affect the lithography process, or the particles may impact or damage the sensitive lithography base. These issues have limited conventional technologies and caused loss of wafers due to the impact on subsequent processing, as well as damage to lithographic components. The present technology overcomes these challenges by performing cleaning operations to limit backside particles from electrostatic chuck coatings. Additionally, the present technology may include forming more hydrophobic coatings on a backside of a substrate, which may provide an amount of lubricity during thermal expansion, and protect substrates from backside damage and particle generation. This may improve substrate protection during processing, especially at increased temperatures.

Although the remaining disclosure will routinely identify specific etching and cleaning processes utilizing the disclosed technology, it will be readily understood that the systems and methods are equally applicable to a variety of other processes as may occur in the described chambers. Accordingly, the technology should not be considered to be so limited as for use with the described etching or cleaning processes alone. The disclosure will discuss one possible system that can be used with the present technology before describing systems, chambers, and methods or operations of exemplary process sequences according to some embodiments of the present technology. It is to be understood that the technology is not limited to the equipment described, and processes discussed may be performed in any number of processing chambers and systems.

Figure 1:
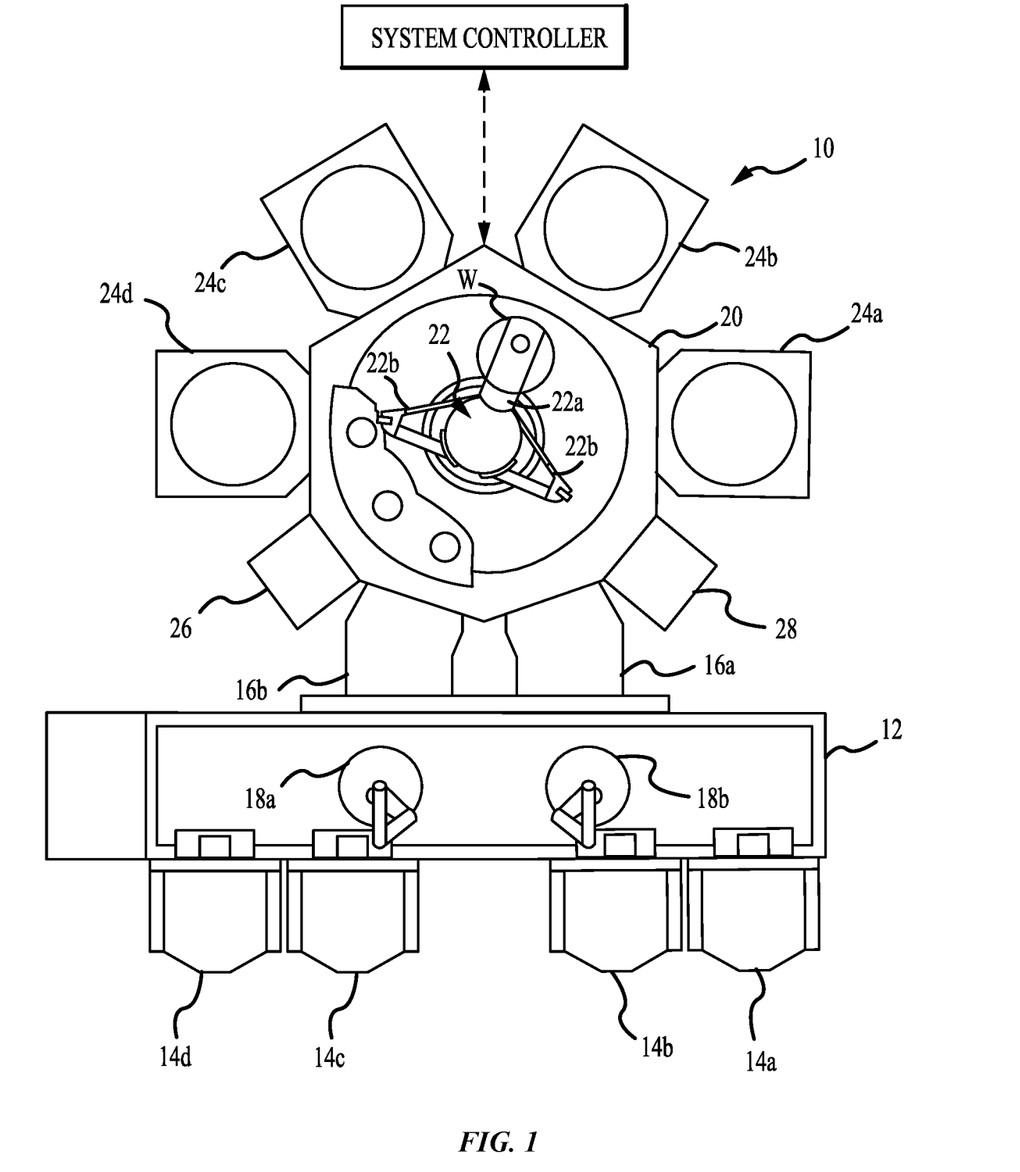
FIG. 1 shows a schematic top plan view of an exemplary processing system according to some embodiments of the present technology.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10.

For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be seasoning deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
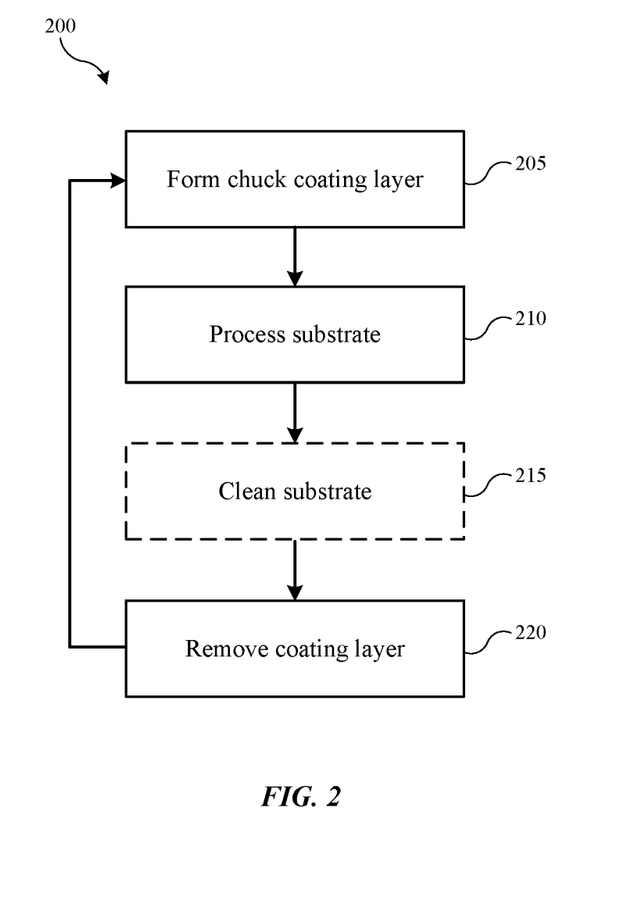
FIG. 2 shows selected operations in a method of semiconductor processing according to some embodiments of the present technology.

The processing system explained above may be used during methods according to embodiments of the present technology. FIG. 2 illustrates a method 200 of processing a semiconductor substrate, operations of which may be performed, for example, in one or more chambers incorporated on multi-chamber processing system 10 as previously described. Any number of chambers may be utilized, which may perform one or more operations of any method or process described. Method 200 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 200 may include a number of operations that may be performed in a number of variations, such as including beginning at different operations of processing. Method 200 may generally include a coating and cleaning set of operations that may occur in chambers in which etch processes may be performed, as well as a substrate cleaning operation that may occur in a chamber on the same tool or a different tool from the etch chambers. Often, the coating may be formed prior to positioning the substrate within the processing chamber to perform semiconductor processing, and the cleaning set of operations may be performed subsequent to the processing, and may occur once the substrate has been removed. Accordingly, although method 200 will be described in a particular order, it is to be understood that the method may be performed in a number of different variations according to embodiments of the present technology.

At operation 205, the method may include forming a layer of material on surfaces of a substrate processing chamber. For example, an oxide coating, such as a silicon oxide coating, may be formed overlying surfaces of the chamber. Any number of silicon-containing precursors may be used in the processing, and in some embodiments a silicon-containing precursor may be delivered to the processing chamber. Silicon-containing precursors that may be used during processing according to some embodiments of the present technology may include silane, di silane, silicon tetrafluoride, silicon tetrachloride, dichlorosilane, tetraethyl orthosilicate, as well as any other silicon-containing precursors that may be used in silicon-containing film formation. Along with the silicon-containing precursor may be delivered an oxidizing gas, which may be or include any oxygen-containing precursor. For example, oxygen-containing precursors may include one or more of diatomic oxygen, ozone, water vapor, an alcohol, nitric oxide, nitrous oxide, or any other oxygen-containing materials.

During the deposition, process pressures may be maintained anywhere between about 3 mT and about 300 mT. Higher process pressures may reduce buildup of coating material in apertures formed within delivery components, for example. However, in some embodiments, the process pressure maintained within the processing chamber during any formation or deposition operations may be less than the process pressure maintained during processing operations performed on a substrate. For example, by maintaining a lower pressure than during processing, a more comprehensive coverage may be produced due to increased residence time. Consequently, when a higher-pressure etch process may be performed, the flow profile during the etch process may not extend beyond coverage aspects of the processing chamber. During the formation, the process may include halting flow of the silicon-containing precursor prior to extinguishing the plasma within the processing chamber. The oxygen-containing precursor flow rate may be maintained subsequent to halting the silicon-containing precursor flow rate, which may allow oxygen-plasma effluents to terminate dangling bonds on a surface of the silicon oxide coating.

Subsequent to formation of the silicon-containing layer, a substrate may be delivered for processing at operation 210. As explained previously, the silicon-containing material, such as silicon oxide, may be more prone to adhere to a backside of a substrate, and during thermal expansion the substrate may remove part of the oxide layer due to stiction. Although silicon-containing particles may be retained on the backside of the substrate, the layer may protect the backside of the substrate from scratches or other damage. Accordingly, in some embodiments, after processing, the substrate may be cleaned at optional operation 215 as discussed below.

In some embodiments, the present technology may form a carbon-containing layer instead of a silicon-containing layer, or in addition to a silicon-containing layer, and which may be formed with a carbon-containing precursor. The layer may be a carbon-containing layer, a halogen-containing layer, or both. For example, in some embodiments a halogen-and-carbon-containing precursor may be provided to produce a layer of material overlying the oxide layer. Exemplary precursors may be or include any number of carbon-containing or organic precursors, as well as halogen-substituted hydrocarbon precursors. For example, precursors may be or include fluoromethane, trifluoromethane, or any other material including carbon, a halogen, and/or hydrogen. Additionally, the carbon-containing precursor may be or include any hydrocarbon, or any material including or consisting of carbon and hydrogen. In some embodiments, the carbon-containing precursor may be characterized by one or more carbon-carbon double bonds and/or one or more carbon-carbon triple bonds.

Accordingly, in some embodiments the carbon-containing precursor may be or include an alkane, alkene, or an alkyne, such as acetylene, ethylene, propene, or any other carbon-containing material. The precursor may include carbon-and-hydrogen-containing precursors, which may include any amount of carbon and hydrogen bonding, along with any other element bonding. Either of the silicon-containing material and/or the carbon-containing material, as well as a combination of the two layers, may be characterized by a thickness of greater than or 20 nm, and may be greater than or about 30 nm, greater than or about 40 nm, greater than or about 50 nm, greater than or about 60 nm, greater than or about 70 nm, greater than or about 80 nm, greater than or about 90 nm, greater than or about 100 nm, greater than or about 110 nm, greater than or about 120 nm, greater than or about 130 nm, greater than or about 140 nm, greater than or about 150 nm, or more.

As noted above, subsequent to coating the chamber, method 200 may include processing a substrate at operation 210. The substrate may be positioned in the processing chamber, such as on an electrostatic chuck or other substrate support. The substrate may be seated directly in contact with the carbon-containing material, and while seated and/or electrostatically clamped, may be heated from an incoming temperature to a processing temperature, which may be greater than or about 100° C. higher than the incoming temperature. The substrate may include layers or materials conventionally employed in the fields of microelectronics, nanotechnology, photovoltaics, or any other semiconductor processes. The process may include plasma etching of the substrate within the processing chamber. The process may include selectively etching materials on the substrate, such as with one or more of a halogen-containing precursor, an oxygen-containing precursor, a hydrogen-containing precursor, and/or an inert precursor. Once the processing has been completed, methods may include removing the substrate from the processing chamber.

Once the substrate has been removed, the coatings may be removed in one or more cleaning operations. For example, a plasma treatment may be performed at operation 220, to remove the remaining carbon-containing material, silicon-containing material, or any other material that may have been applied. For example, a plasma of an oxygen-containing precursor, such as any precursor previously described, may be formed to remove the carbon-containing material. Additionally, a halogen-containing plasma may be applied to remove a silicon-containing material. In some embodiments, once the cleaning operations have been completed, subsequent processing may involve preparing the processing chamber for additional substrates. For example, in some embodiments the method may include repeating one or more operations described previously, such as performing one or more coating operations, including a silicon-containing material and/or a carbon-containing material, on surfaces of the chamber prior to processing an additional substrate.

As noted above, the silicon-containing particles remaining on the substrate may be removed by performing a series of cleaning operations, which may be performed in a wet-etch chamber on the backside of the substrate. Any number of chemistries may be used in the process, although in some embodiments, the chemistries may be tuned specifically to remove silicon oxide particles remaining on the backside surface. For example, chemistries may include ammonium hydroxide, hydrogen peroxide, hydrofluoric acid, hydrochloric acid, or any number of combinations of these materials, which may be heated and/or diluted. The solutions may be used to etch any number of residual materials, and may be used to limit interaction with materials exposed on the front side of the substrate.

Although any number of solutions may be used, in some embodiments solutions may be characterized by increased strength to facilitate complete removal during etching and scrubbing operations, although the specific oxide removal may be performed with a dilute etch process, which may protect the backside of the wafer from scratching and pitting, which may cause issues with downstream processing by damaging the wafer integrity. For example, a first etch may be performed with a higher strength material to remove any organic material remaining. The clean may include a combination of ammonium hydroxide and hydrogen peroxide diluted in deionized water, and may be characterized by a reduced dilution, such as 1:2:10, 1:1:5, or less, to increase the ease of removal. The materials may be heated to a temperature of greater than or about 20° C., greater than or about 30° C., greater than or about 40° C., greater than or about 50° C., greater than or about 60° C., greater than or about 70° C., greater than or about 80° C., or more, during the wet cleaning.

Subsequent cleaning may include exposure to dilute halogen etchants, which may be specifically tailored for removal of residual oxide particles from chamber coatings. For example, a clean may be performed with hydrogen fluoride diluted in deionized water to a ratio of greater than or about 1:50, and which may be diluted to a ratio of acid to water of greater than or about 1:60, greater than or about 1:70, greater than or about 1:80, greater than or about 1:90, greater than or about 1:100, greater than or about 1:110, greater than or about 1:120, greater than or about 1:130, greater than or about 1:140, greater than or about 1:150, or more. Although the etchant may be heated, in some embodiments the clean may be performed at about room temperature to further limit an effect of the backside of the wafer. An ionic clean may then be performed with hydrochloric acid and hydrogen peroxide diluted in deionized water, which may be characterized by an increased dilution, such as greater than or about 1:1:10, and which may be diluted to a ratio of acid to hydrogen peroxide to water of greater than or about 1:1:20, greater than or about 1:1:30, greater than or about 1:1:40, greater than or about 1:1:50, or greater. The clean may be performed at any of the temperatures noted above. In some embodiments, a scrubbing may not be performed, which may limit physical interaction with the backside of the substrate. By utilizing cleaning and coatings according to some embodiments of the present technology, improved particle removal may be performed while limiting backside interaction that may cause scratching or other damage.

Figure 3:
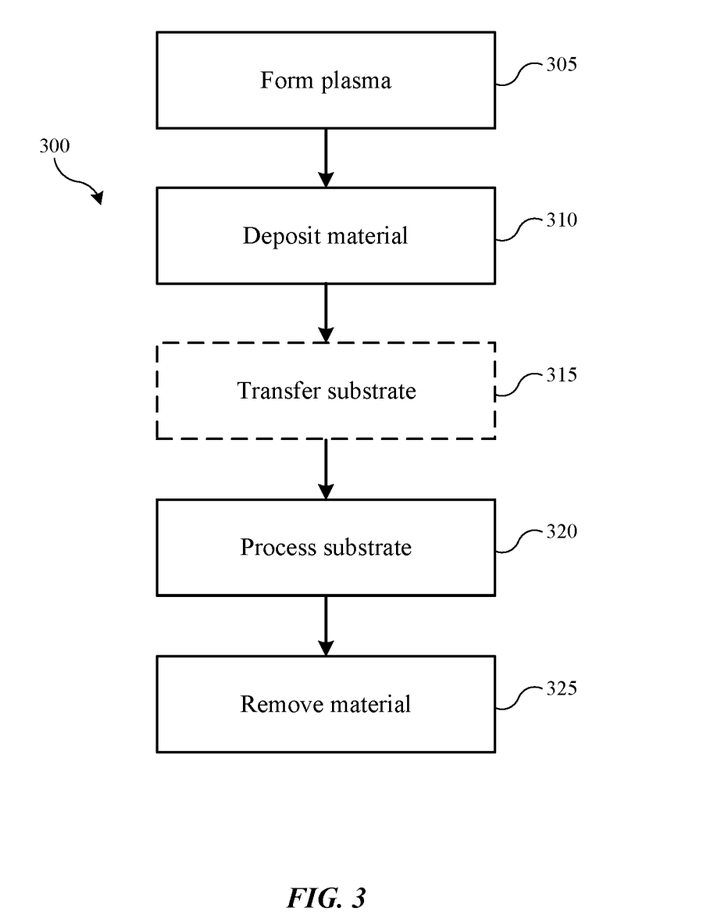
FIG. 3 shows selected operations in a method of semiconductor processing according to some embodiments of the present technology.

The present technology may also encompass substrate coatings, which may protect the backside of the substrate from damage as well as limit particle interaction with downstream processing. FIG. 3 shows selected operations in a method 300 of semiconductor processing according to some embodiments of the present technology. It is to be understood that substrates coated according to method 300 may be included in chambers coated in method 200, and the two methods may be performed together in some embodiments of the present technology. Any number of chambers may be utilized, which may perform one or more operations of any method or process described, although in some embodiments the backside coating may be performed in one of the chambers discussed further below. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

After any amount of processing as may occur during semiconductor fabrication, a substrate may be delivered to a chamber configured for backside coating. Once the substrate is positioned in the chamber with the substrate backside exposed, at operation 305 the method may include forming a plasma of a carbon-containing material within the processing region of the chamber. The carbon-containing material may be or include any of the carbon-containing precursors noted above. At operation 310, the method may include depositing a carbon-containing material on a backside of the substrate. The carbon-containing material may be a softer amorphous carbon film, or a doped harder material in some embodiments. Any dopants may be included in the carbon-containing material according to embodiments of the present technology.

In some embodiments, the deposition may be performed to limit or reduce deposition on the front side of the substrate, which may have one or more other material layers formed, and in some embodiments the front side of the substrate may be maintained substantially free of carbon-containing material during the deposition. For example, by substantially may be meant that greater than or about 80% of the surface of the front side of the wafer may remain free of carbon-containing material, and substantially may mean greater than or about 85% of the surface of the front side of the wafer may remain free of carbon-containing material, greater than or about 90% of the surface of the front side of the wafer may remain free of carbon-containing material, greater than or about 95% of the surface of the front side of the wafer may remain free of carbon-containing material, greater than or about 99% of the surface of the front side of the wafer may remain free of carbon-containing material, or the entire front side is essentially free of carbon-containing material, although trace amounts may occur without affecting processing of the front side of the wafer in subsequent operations.

Although the carbon-containing material may be deposited directly on the backside of the wafer surface, in some embodiments the carbon-containing material may be deposited over an additional film. For example, a silicon nitride, silicon-containing, or some other film may be deposited on the backside of the substrate, which may be used to counteract wafer bowing, for example, or provide some other benefit for processing. This film may be a relatively harder film or a hydrophilic film, and thus, in some embodiments the carbon-containing film may be deposited overlying the other film prior to subsequent processing. After the backside of the substrate, or an overlying film on the backside of the substrate, has been coated in a carbon-containing material, the substrate may be transferred to another chamber at optional operation 315. The subsequent chamber may be where any number of operations, such as deposition, etching, or any other processing may be performed. The second chamber in which processing may occur may be on the same tool or a different tool in some embodiments, and may include coatings as previously described. When the backside-coating chamber, which may be a chamber as described below, for example, and the second chamber are on the same platform, the substrate may be processed without exposure to atmosphere, and the substrate may not be removed from vacuum conditions between the backside coating and subsequent processing.

Once in a processing chamber, the substrate may be processed at operation 320, which may include one or more of a deposition operation, an etching operation, or some other processing operation, including a combination of any number of processing operations, which may be performed on the front side of the substrate, while the carbon-coated backside is disposed against a substrate support. By maintaining a carbon-containing film on the backside of the substrate, the backside may be protected from particles and thermal expansion induced scratches. Although the carbon-containing film, which may be formed to any thickness of coatings discussed above, may be damaged or retain particles, the substrate may otherwise be maintained protected by the coating.

After processing is completed, the carbon-containing film may be removed from the backside of the substrate. The removal may be performed with an oxygen-containing plasma, which may include utilizing any oxygen-containing precursor previously described. In some embodiments, the removal may also be a plasma-enhanced process. The removal may occur in the same chamber in which the formation of the backside coating was performed, or in a different chamber. Again, the removal chamber may be on the same platform in some embodiments, which may maintain the substrate in vacuum conditions. Additionally, such a tool configuration may facilitate any particle removal prior to delivering the substrate to a front-opening unified pod, in which other substrates may be exposed to retained particles. For example, as noted above, the carbon-containing film may be damaged or retain particles during processing. However, by removing the carbon-containing film directly after processing on a separate chamber on the same tool, the particles that may be retained on the film may also be removed. This may limit the amount of particles on the backside of the substrate in any subsequent processing. For example, a subsequent lithography operation may be performed, and by removing excess particles, the substrate support in the lithography device may be protected from damage. Additionally, improved lithographic processing may be performed due to limited or no scratches being formed on the backside of the wafer. Accordingly, embodiments of the present technology may improve processing over any number of conventional techniques.

Figure 4:
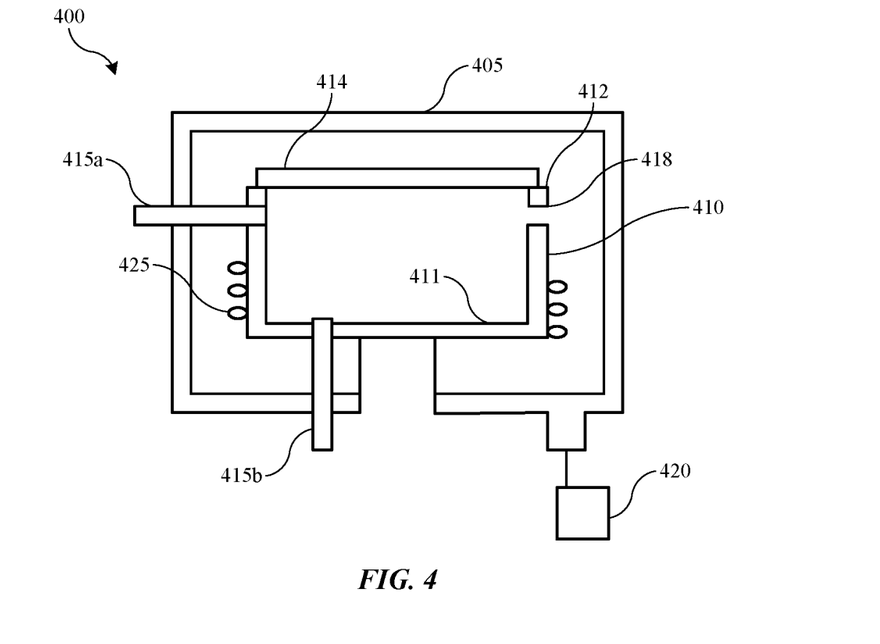
FIG. 4 shows a schematic cross-sectional view of an exemplary processing system according to some embodiments of the present technology.

Depositing films on the backside of the substrate may be performed in any number of chambers according to embodiments of the present technology. In some embodiments, a load lock or separate processing chamber may be configured for backside deposition or removal. FIG. 4 shows a schematic cross-sectional view of an exemplary processing system 400 according to some embodiments of the present technology. It is to be understood that system 400 is a schematic view illustrating aspects of chambers, which may include any number of additional or alternative components still encompassed by embodiments of the present technology, as would be readily appreciated by the skilled artisan. As noted above, the system may be part of a load lock, or may be a standalone processing chamber according to some embodiments of the present technology.

System 400 may include a chamber body 405, which may define an interior volume or processing region within the chamber. Within the processing region may be a substrate support 410, which may be or include a platform 412 that defines an annular seat, such as at a top surface, and on which a substrate 414 may be seated. In some embodiments the substrate may be seated on the support only about an exterior or periphery of the substrate, which may be a distance from an outer edge of the wafer of less than or about 10 mm, and may be less than or about 8 mm, less than or about 6 mm, less than or about 5 mm, less than or about 4 mm, less than or about 3 mm, or less. The substrate support may also define a recess 411 from an upper surface of the platform as illustrated, and which may produce an interior or recessed volume between the backside of the substrate 414 and the recessed surface of the support.

System 400 may include one or more accesses into the interior volume, which may be defined in the platform of the support, and which may include multiple components in some embodiments. For example, substrate support 410 may define one or more apertures 418 about the support, which may provide access to and/or from the internal volume. For example, one or more apertures may provide access for a fluid delivery component 415a, which may be used to deliver one or more precursors, such as a carbon-containing and/or an oxygen-containing precursor, into the internal volume beneath the substrate. Additionally, in some embodiments a fluid delivery component 415b may be used to deliver precursors to the bottom of the internal volume. Apertures 418 may also or only be used to provide access from the volume, and which may allow a pump 420 to provide exhaust capabilities, where deposition materials or etchant byproducts may be exhausted from the volume and from the chamber. This may limit exposure of the front side of the substrate to any deposition or etchant materials as discussed above.

The systems may also include one or more electrodes in embodiments of the present technology. For example, an electrode may be incorporated in the platform portion of the substrate support, such as adjacent the wafer, which may operate as an electrostatic chuck, and may clamp the substrate to prevent movement during processing. Additionally, one or more electrodes may be incorporated to provide plasma capabilities within the processing chamber. FIG. 4 illustrates a first example of an electrode configuration in which an inductively-coupled plasma may be produced. For example, a coiled electrode 425 may extend about a portion of the support, and may be powered to generate a plasma within the interior volume of the support where deposition or etchant precursors may be delivered. In this example, a portion of the support, such as the recessed base portion about which the electrode is coiled, may be a dielectric material. The platform 412 may be the same or a different material in some embodiments, which may also include conductive materials to operate as an electrostatic chuck. By forming a controlled volume in which plasma may be generated, deposition and removal may be performed only on the backside of the wafer, while the exhaust and substrate support may operate to limit or prevent exposure of the front side of the wafer.

Figure 5:
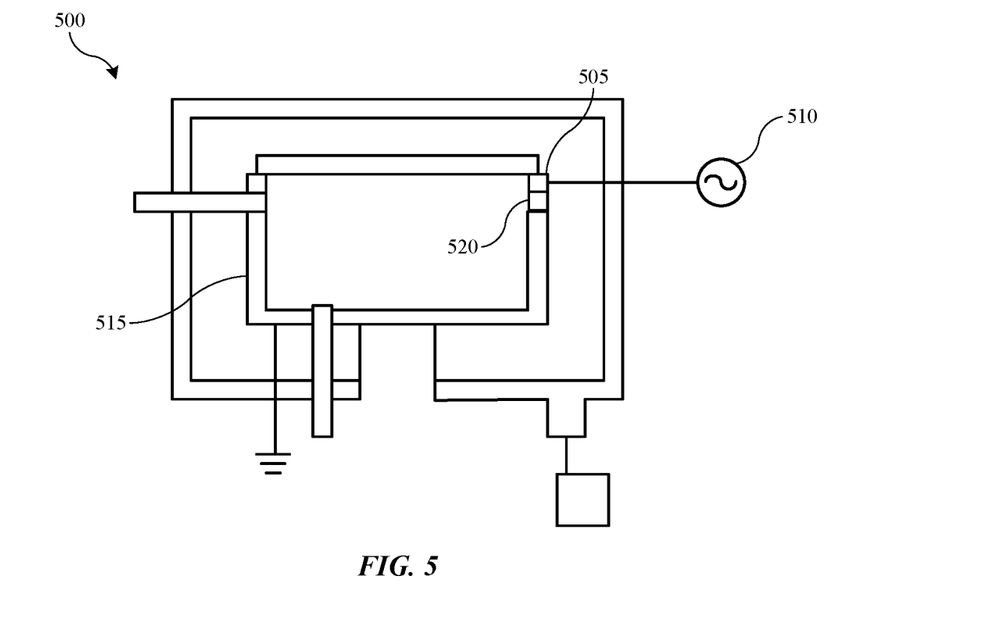
FIG. 5 shows a schematic cross-sectional view of an exemplary processing system according to some embodiments of the present technology.

FIG. 5 shows a schematic cross-sectional view of an exemplary processing system 500 according to some embodiments of the present technology, and which may illustrate an additional plasma generation system according to some embodiments of the present technology, such as a capacitively-coupled plasma generation system. It is to be understood that system 500 may include any feature, component, or characteristic of processing system 400 discussed above, and may illustrate additional and/or alternative features of system 400.

As illustrated in FIG. 5, a first electrode may be embedded in platform portion 505, which may be operated as an electrostatic chuck, for example. The same or a different electrode may also be incorporated in the platform portion and coupled with a power source 510. In some embodiments, the recessed base 515 may be a dielectric material, and the chamber base may be grounded, which may allow a capacitively-coupled plasma to be formed. Additionally, in some embodiments the recessed base may be conductive, and may be grounded. To prevent shorting, a spacer 520, which may be a dielectric material, may be positioned between the recessed base and the platform. The spacer may also define the apertures allowing byproducts to be exhausted as described above. By utilizing a capacitively-coupled plasma in some embodiments, an amount of impact or bombardment may be applied to deposition, which may at least partially densify deposited films, or may facilitate a more aggressive removal operation.

Figure 6:
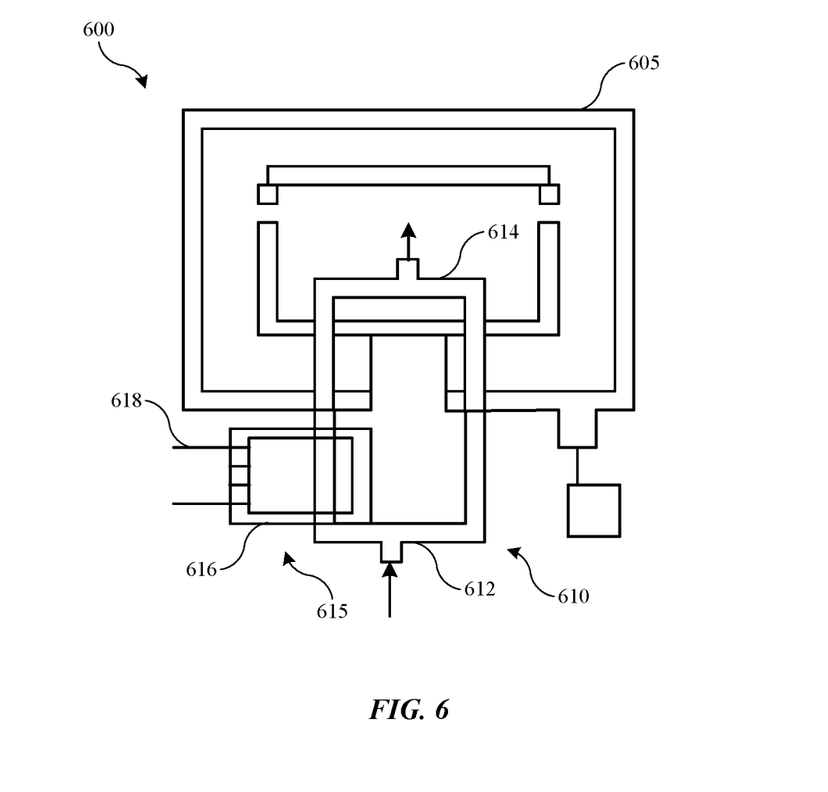
FIG. 6 shows a schematic cross-sectional view of an exemplary processing system according to some embodiments of the present technology.

FIG. 6 shows a schematic cross-sectional view of an exemplary processing system 600 according to some embodiments of the present technology, and which may illustrate an additional plasma generation system according to some embodiments of the present technology, such as a partially remote plasma generation system. It is to be understood that system 600 may include any feature, component, or characteristic of processing system 400 and/or 500 discussed above, and may illustrate additional and/or alternative features of system 400 and/or 500.

As illustrated in FIG. 6, system 600 may include a chamber 605 and a toroidal plasma source 610, which may extend into and out of the processing region to provide a controlled delivery of precursors or plasma radicals. For example, a first half 612 of a plasma loop may be positioned outside of processing chamber 605, and may define an inlet to receive one or more precursors for deposition or etching. A second half 614 of the plasma loop may extend into the chamber, and may extend into the internal recess of the substrate support as illustrated. The second half 614 may define an outlet from which plasma effluents may be delivered for deposition or etching. In some embodiments additional precursors, such as deposition precursors including a carbon-containing precursor, may be provided directly into the recessed volume as discussed above, and which may be dissociated or energized by the provided plasma materials. Additionally, the plasma materials may include all precursors for deposition and/or etching in some embodiments.

A power transformer 615 may couple electromagnetic energy into the loop to generate plasma of the delivered precursors. For example, the power transformer may include a magnetic core 616, which may extend about the loop. The power transformer may also include a primary coil 618, which may apply voltage for generating plasma. By utilizing a toroidal plasma source in which the plasma components may be maintained outside of the processing chamber, the source may be used in a chamber to provide plasma effluents to a desired region within the chamber, and which may be used to deposit or etch materials on the backside of a substrate without internal plasma generation that may affect the backside of the substrate. The present technology may dramatically reduce particles and scratches on semiconductor substrates by forming one or more protective films to accommodate semiconductor processing.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the coating" includes reference to one or more coatings and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor processing, the method comprising:

forming a plasma of a carbon-containing material within a processing region of a semiconductor processing chamber, wherein the semiconductor processing chamber comprises a substrate support configured to support a substrate about an outer edge of the substrate, and the semiconductor processing chamber defines a volume beneath the substrate seated on the substrate support;

depositing a carbon-containing material on a backside of a substrate housed within the processing region of the semiconductor processing chamber, wherein a front side of the substrate is maintained substantially free of the carbon-containing material;

performing an etch process on the front side of the substrate; and removing the carbon-containing material from the backside of the substrate.

2. The method of semiconductor processing of claim 1, wherein removing the carbon-containing material from the backside of the substrate comprises:

forming a plasma of an oxygen-containing material, and etching the carbon-containing material from the backside of the substrate.

3. The method of semiconductor processing of claim 1, wherein the substrate comprises a first backside coating comprising a silicon-containing material, and the carbon-containing material is deposited overlying the silicon-containing material.

4. The method of semiconductor processing of claim 1, wherein the plasma of the carbon-containing material is formed in the volume beneath the substrate seated on the substrate support.

5. The method of semiconductor processing of claim 1, wherein the substrate comprises a first backside coating comprising a silicon-containing material, and the carbon-containing material is deposited overlying the silicon-containing material.

6. A method of semiconductor processing, the method comprising:
forming a plasma of a carbon-containing material within a processing region of a semiconductor processing chamber, the semiconductor processing chamber comprising:
a substrate support, wherein the substrate support comprises:
a platform defining an annular seat operable to support a semiconductor substrate about a periphery of the semiconductor substrate, wherein the platform defines an internal recess extending within the annular seat; and
one or more electrodes operable to seat a substrate or generate plasma within the internal recess; and
depositing a carbon-containing material on a backside of a substrate housed within the processing region of the semiconductor processing chamber.

7. The method of semiconductor processing of claim 6, wherein the platform comprises a recessed base defining the internal recess, and wherein the one or more electrodes comprise:
an electrode extending about the recessed base as a coil operable as an inductively-coupled plasma coil.

8. The method of semiconductor processing of claim 7, wherein the recessed base comprises a dielectric material.

9. The method of semiconductor processing of claim 8, wherein the platform comprises an electrode in the annular seat, the electrode operable as an electrostatic chuck for the semiconductor substrate.

10. The method of semiconductor processing of claim 9, wherein the platform comprises a recessed base defining the internal recess, wherein the recessed base is grounded relative to the annular seat, and wherein a capacitively coupled plasma is formable within the internal recess.

11. The method of semiconductor processing of claim 8, wherein the semiconductor processing chamber comprises a portion of a toroidal plasma loop extending into the internal recess, and operable to deliver plasma effluents into the internal recess.

12. The method of semiconductor processing of claim 11, wherein a portion of the toroidal plasma loop extends outside of the semiconductor processing chamber.

13. The method of semiconductor processing of claim 12, wherein the portion of the toroidal plasma loop extending outside of the semiconductor processing chamber defines an access for precursor delivery.

14. The method of semiconductor processing of claim 8, wherein the substrate support defines one or more accesses for precursor delivery into the internal recess.

15. The method of semiconductor processing of claim 8, wherein the substrate support defines one or more accesses for exhaust from the internal recess.

16. The method of semiconductor processing of claim 8, wherein a front side of the substrate is maintained substantially free of carbon-containing material during the depositing, the method further comprising:
performing an etch process on the front side of the substrate; and
removing the carbon-containing material from the backside of the substrate.

17. A method of semiconductor processing, the method comprising:
forming a plasma of a carbon-containing material in a first semiconductor processing chamber;
depositing a carbon-containing material on a backside of a substrate in the first semiconductor processing chamber, wherein a front side of the substrate is maintained substantially free of carbon-containing material;
subsequent to the depositing, transferring the substrate to a second semiconductor processing chamber;
performing an etch process on the front side of the substrate in the second semiconductor processing chamber;
subsequent to the etch process, transferring the substrate back to the first semiconductor processing chamber; and
removing the carbon-containing material from the backside of the substrate in the first semiconductor processing chamber.

18. The method of semiconductor processing of claim 17, wherein the first semiconductor processing chamber and the second semiconductor processing chamber are part of a single processing platform.

19. The method of semiconductor processing of claim 17, wherein removing the carbon-containing material from the backside of the substrate comprises:
forming a plasma of an oxygen-containing material, and etching the carbon-containing material from the backside of the substrate.

* * * * *